United States Patent
Ito et al.

(10) Patent No.: US 10,757,352 B2
(45) Date of Patent: Aug. 25, 2020

(54) SOLID-STATE IMAGING DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventors: Yohei Ito, Yokohama Kanagawa (JP); Yasushi Itabashi, Itabashi Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 20 days.

(21) Appl. No.: 16/128,827

(22) Filed: Sep. 12, 2018

(65) Prior Publication Data

US 2019/0335125 A1  Oct. 31, 2019

(30) Foreign Application Priority Data

Apr. 25, 2018  (JP) .................................. 2018-083698

(51) Int. Cl.
*H04N 5/369* (2011.01)
*H01L 27/146* (2006.01)

(52) U.S. Cl.
CPC ....... *H04N 5/369* (2013.01); *H01L 27/14623* (2013.01); *H01L 27/14636* (2013.01)

(58) Field of Classification Search
CPC .................................................. H04N 5/369
USPC ........................................................ 348/249
See application file for complete search history.

(56) References Cited

U.S. PATENT DOCUMENTS

| 4,694,317 A * | 9/1987 | Higashi | ........... H01L 31/022466 257/435 |
| 8,975,670 B2 * | 3/2015 | Or-Bach | ............... H01L 23/552 257/272 |
| 2012/0037960 A1 * | 2/2012 | Yokoyama | ........ H01L 27/14623 257/230 |
| 2016/0198083 A1 * | 7/2016 | Kitano | ..................... G02B 7/34 348/340 |

FOREIGN PATENT DOCUMENTS

| JP | H08-222721 A | 8/1996 |
| JP | 2008-218755 A | 9/2008 |
| JP | 2010-135695 A | 6/2010 |

* cited by examiner

*Primary Examiner* — Joel W Fosselman
(74) *Attorney, Agent, or Firm* — White & Case LLP (57) ABSTRACT

According to one embodiment, a solid-state imaging device includes a substrate, a light receiving pixel, a first interconnection layer, a light shielding layer, and a first metal film. The substrate includes a sensor region and a circuit region. The light receiving pixel is provided on a surface of the sensor region of the substrate. The first interconnection layer is provided in the sensor region. The light shielding layer is provided in the sensor region and has a larger width than the first interconnection. The first metal film is provided on at least one of an upper surface or a lower surface of the light shielding layer. The first metal film partially covers at least one of the upper surface or the lower surface.

13 Claims, 7 Drawing Sheets

SOLID-STATE IMAGING DEVICE

CROSS-REFERENCE TO RELATED APPLICATIONS

This application is based upon and claims the benefit of priority from Japanese Patent Application No. 2018-083698, filed on Apr. 25, 2018; the entire contents of which are incorporated herein by reference.

FIELD

Embodiments described herein relate generally to a solid-state imaging device.

BACKGROUND

The structure of a solid-state imaging device has been known, which a barrier metal film is provided on a surface of an interconnection layer of a sensor region including a light receiving pixel.

DETAILED DESCRIPTION

According to one embodiment, a solid-state imaging device includes a substrate, a light receiving pixel, a first interconnection layer, a light shielding layer, and a first metal film. The substrate includes a sensor region and a circuit region. The light receiving pixel is provided on a surface of the sensor region of the substrate. The first interconnection layer is provided in the sensor region. The light shielding layer is provided in the sensor region and has a larger width than the first interconnection. The first metal film is provided on at least one of an upper surface or a lower surface of the light shielding layer. The first metal film partially covers at least one of the upper surface or the lower surface.

Various embodiments will be described hereinafter with reference to the accompanying drawings. In the drawings, similar components are marked with like reference numerals.

Figure 1:
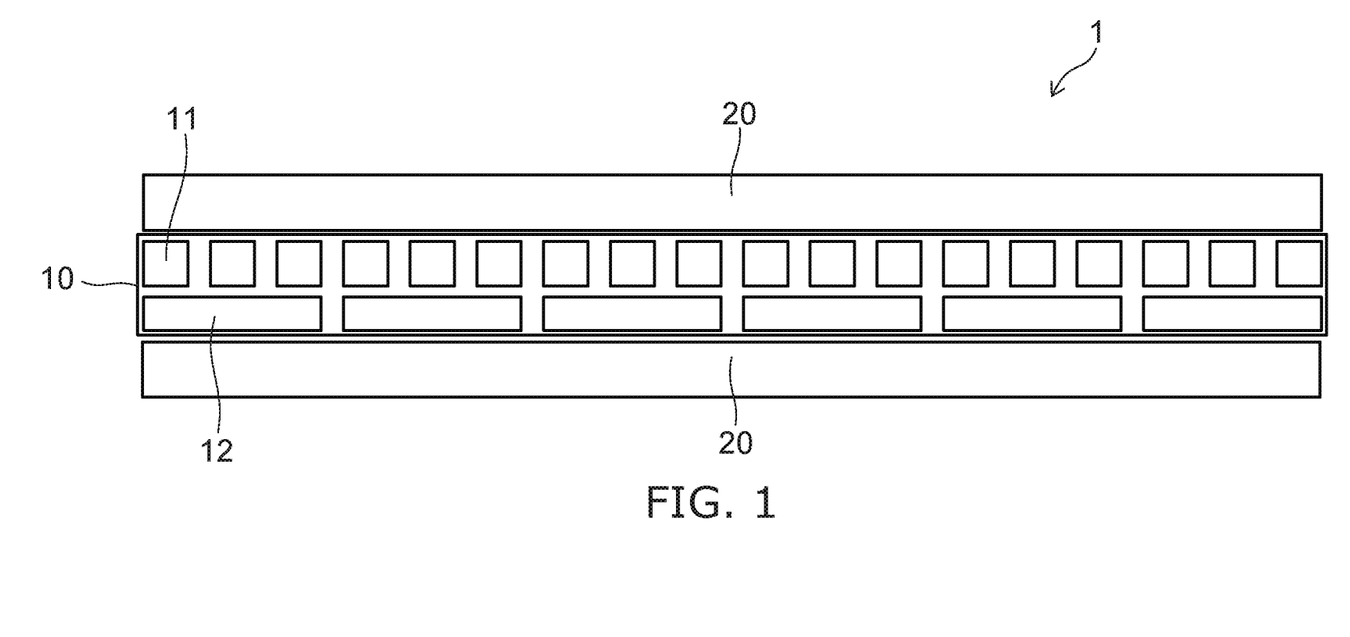
FIG. 1 is a schematic plane layout drawing of a solid-state imaging device of an embodiment of the invention.

FIG. 1 is a plane layout drawing of a solid-state imaging device 1 of the embodiment of the invention.

The solid-state imaging device 1 includes a sensor region 10 and a circuit region 20. The sensor region 10 and the circuit region 20 are formed on the same substrate.

Multiple light receiving pixels 11 and multiple charge transfer parts 12 are formed in the sensor region 10. The light receiving pixel 11 includes a photoelectric conversion part. The charge transfer part 12 includes a charge transfer transistor. The solid-state imaging device 1 of the embodiment is, for example, a linear sensor, and has a pixel column in which the multiple pixel columns 11 are arranged in one direction.

A logic circuit controlling the operation of the sensor region 10 is formed in the circuit region 20. The logic circuit includes, for example, a MOS transistor.

Figure 2:
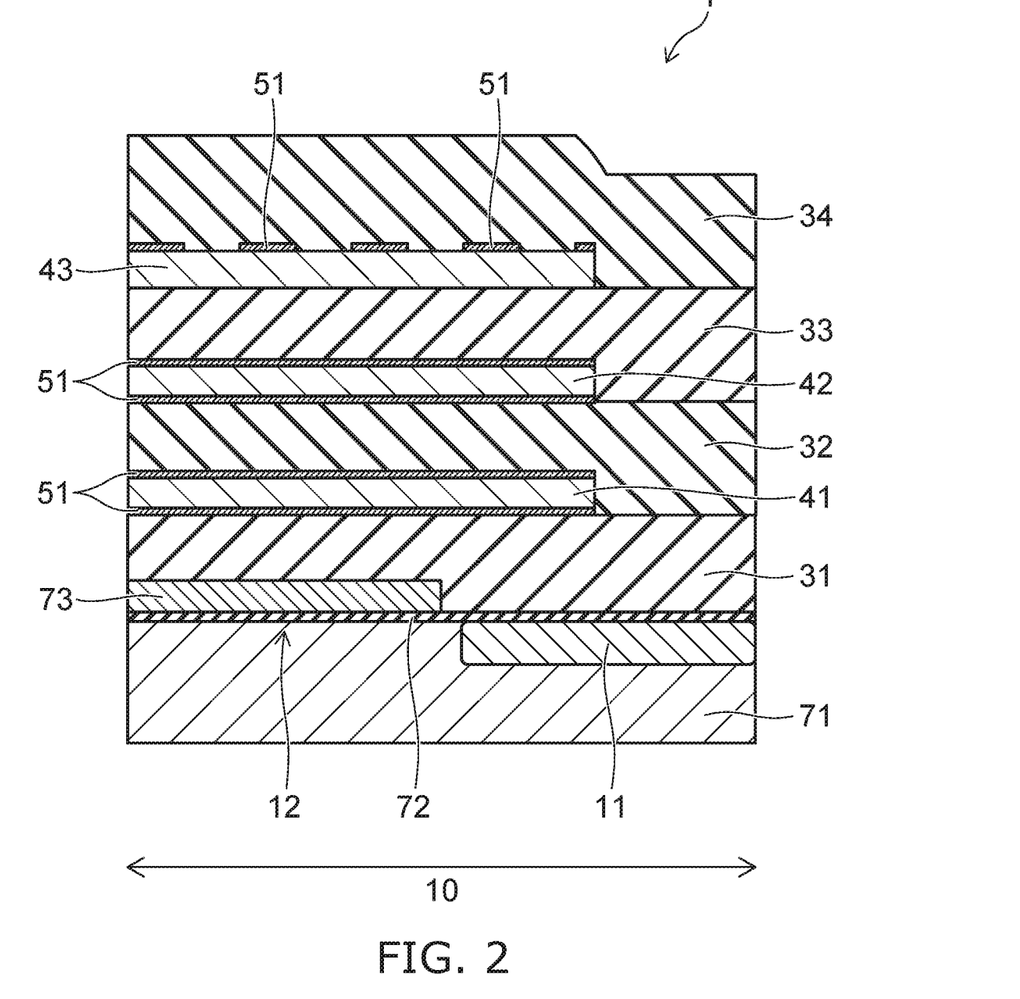
FIG. 2 is a schematic cross-sectional view of a sensor region in the solid-state imaging device of the embodiment of the invention.

FIG. 2 is a schematic cross-sectional view of the sensor region 10 in the solid-state imaging device 1.

The light receiving pixel 11 is formed on a surface of the sensor region 10 of a substrate 71. The substrate 71 is, for example, a silicon substrate. The light receiving pixel 11 includes, for example, a PN junction of N-type silicon and P-type silicon.

An insulating film 72 is formed on the surface of the substrate 71. The insulating film 72 is, for example, a silicon oxide film.

A gate electrode 73 of the charge transfer transistor is provided on the insulating film 72 in a region adjacent to the light receiving pixel 11.

An interlayer insulating film 31 is provided on the insulating film 72 so as to cover the gate electrode 73. For example, multiple interconnection layers 41, 42 are formed on the interlayer insulating film 31. An interlayer insulating film 32 is provided between the interconnection layer 41 and the interconnection layer 42.

A light shielding layer 43 is provided on the interconnection layer 42. An interlayer insulating film 33 is provided between the interconnection layer 42 and the light shielding layer 43. The light shielding layer 43 has a larger width or a larger area than each of the interconnection layer 41 and the interconnection layer 42.

An insulating film 34 is provided on the light shielding layer 43, and the light shielding layer 43 is covered with the insulating film 34.

The interlayer insulating films 31 to 33 and the insulating film 34 are, for example, silicon oxide films. The interlayer insulating films 31 to 33 and the insulating film 34 are formed, for example, by CVD (Chemical Vapor Deposition), and the interlayer insulating films 31 to 33 and the insulating film 34 include hydrogen due to the source gas at the CVD.

The interconnection layers 41, 42 and the light shielding layer 43 are metal layers, and for example, include aluminum as a main component.

Barrier metal films 51 are provided on an upper surface and a lower surface of each of the interconnection layer 41 and the interconnection layer 42.

Figure 3A:
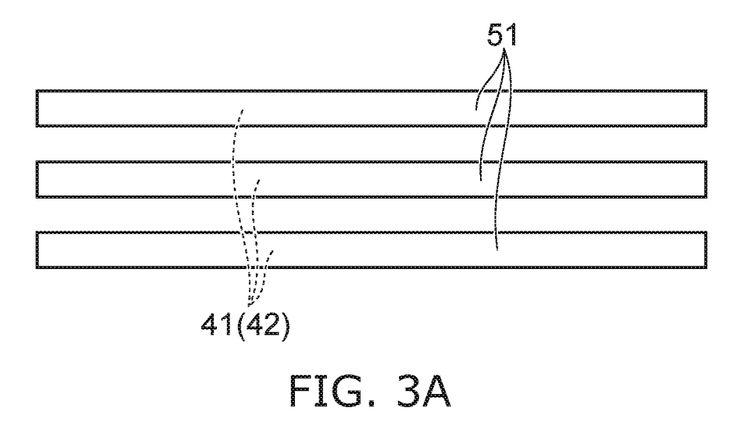
FIGS. 3A and 3B are schematic plan views of a barrier metal film on an interconnection layer in the solid-state imaging device of the embodiment of the invention.

FIG. 3A is a schematic plan view of the interconnection layers 41 (42) and the barrier metal films 51 on the interconnection layers 41 (42).

The barrier metal films 51 cover the entire upper surface and the entire lower surface of the interconnection layer 41. The barrier metal films 51 cover the entire upper surface and the entire lower surface of the interconnection layer 42.

The barrier metal films 51 are provided also on an upper surface of the light shielding layer 43. The barrier metal film 51 partially covers the upper surface of the light shielding layer 43. The barrier metal film 51 provided on the upper surface of the light shielding layer 43 have a portion covering the upper surface of the light shielding layer 43 and a portion (opening) not covering the upper surface of the light shielding layer 43.

FIG. 4A to FIG. 5C are schematic plan views of the light shielding layer 43 and the barrier metal film 51 on the light shielding layer 43.

Figure 4A:
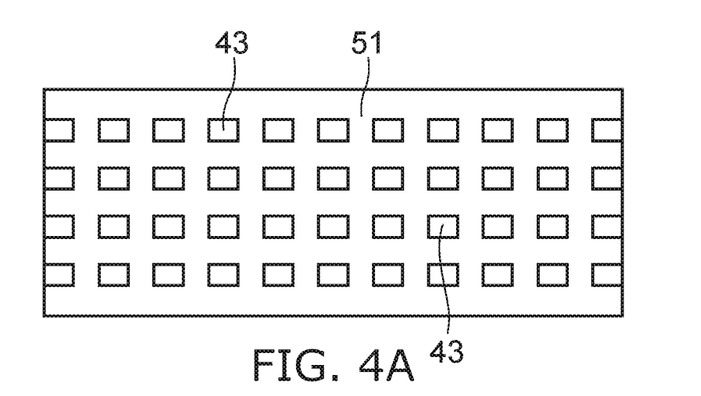
FIGS. 4A to 4C are schematic plan views of a barrier metal film on a light shielding layer of the sensor region in the solid-state imaging device of the embodiment of the invention.

In the example shown in FIG. 4A, the barrier metal film 51 is formed in a lattice pattern.

Figure 4B:
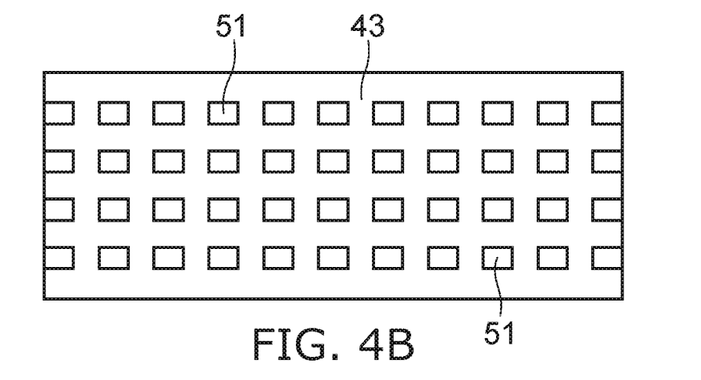

In the example shown in FIG. 4B, portions where the barrier metal film 51 is not provided on the upper surface of the light shielding layer 43 are formed in a lattice pattern.

Figure 4C:
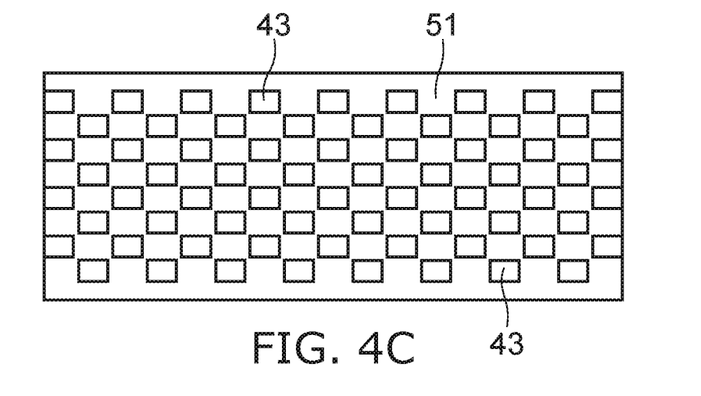
Figure 5A:
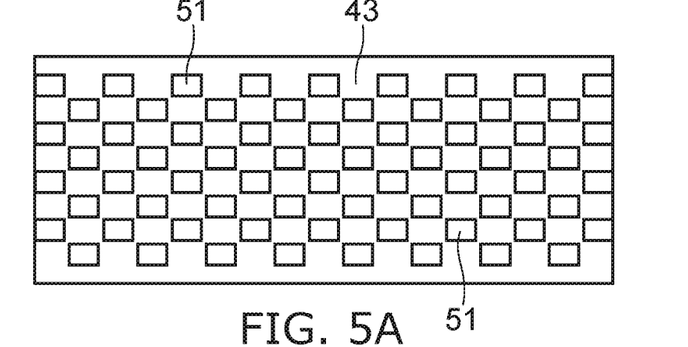
FIGS. 5A to 5C are schematic plan views of a barrier metal film on a light shielding layer of the sensor region in the solid-state imaging device of the embodiment of the invention.

In the examples shown in FIG. 4C and FIG. 5A, the barrier metal film 51 and portions where the barrier metal film 51 is not formed on the upper surface of the light shielding layer 43 are formed in a check pattern.

Figure 5B:
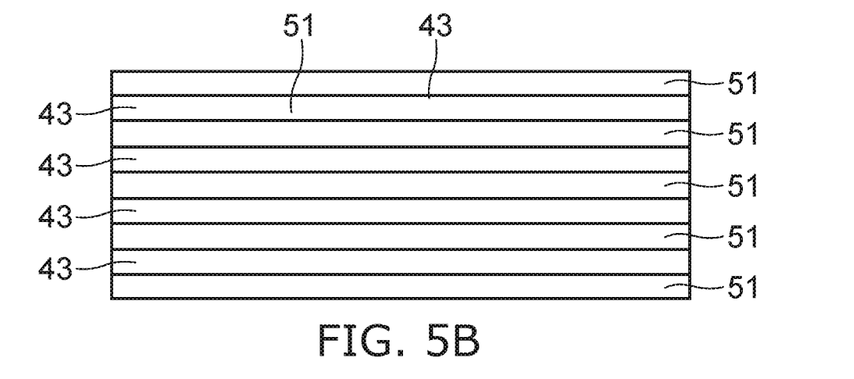
Figure 5C:
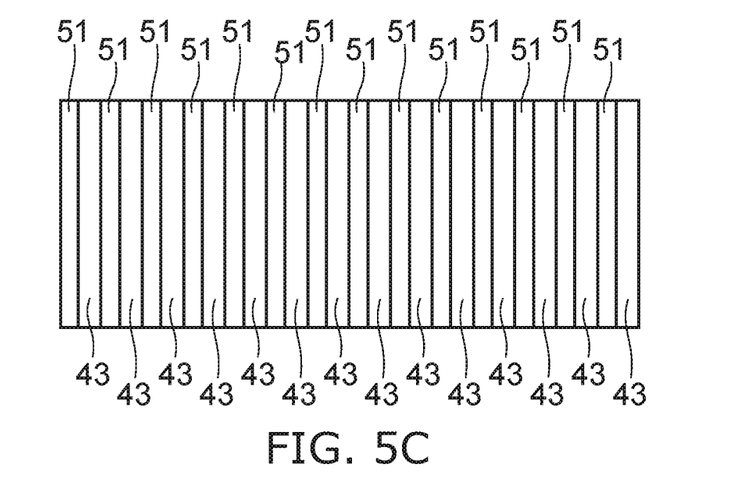

In the examples shown in FIGS. 5B and 5C, the barrier metal film 51 and portions where the barrier metal film 51 is not formed on the upper surface of the light shielding layer 43 are formed in a slit pattern.

The barrier metal film 51 is metal film of a material different from the metal layers of the interconnection layers 41, 42 and the light shielding layer 43. The barrier metal film 51 includes, for example, titanium.

Figure 6:
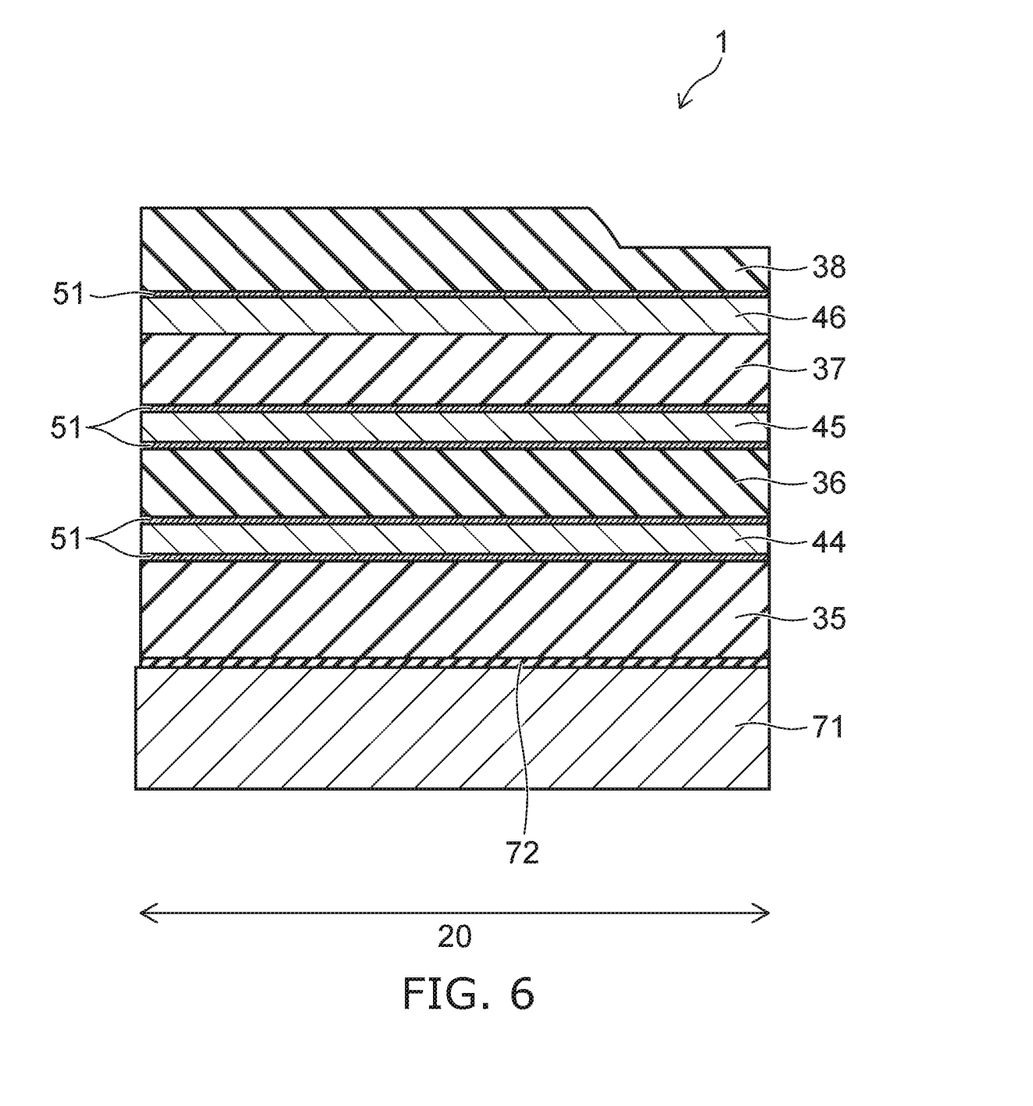
FIG. 6 is a schematic cross-sectional view of a circuit region in the solid-state imaging device of the embodiment of the invention.

FIG. 6 is a schematic cross-sectional view of the circuit region 20 in the solid-state imaging device 1 of the embodiment.

The light receiving pixel is not formed on the surface of the circuit region 20 of the substrate 71. The insulating film 72 is formed on the surface of the substrate 71, and multiple interconnection layers 44 to 46 and multiple interlayer insulating films 35 to 37 are provided on the insulating film 72.

An insulating film 38 is provided on the upper most interconnection layer 46, and the interconnection layer 46 is covered with the insulating film 38.

The interlayer insulating films 35 to 37 and the insulating film 38 are, for example, silicon oxide films. The interconnection layers 44 to 46 are metal layers, and include aluminum as a main component, for example.

The barrier metal film 51 is provided on an upper surface and a lower surface of each of the interconnection layers 44, 45. The barrier metal film 51 covers the entire upper surface and the entire lower surface of the interconnection layer 44. The barrier metal film 51 covers the entire surface and the entire lower surface of the interconnection layer 45.

The barrier metal film 51 is provided on the upper surface of the upper most interconnection layer 46, and the barrier metal layer 51 covers the entire upper surface of the interconnection layer 46.

Figure 3B:
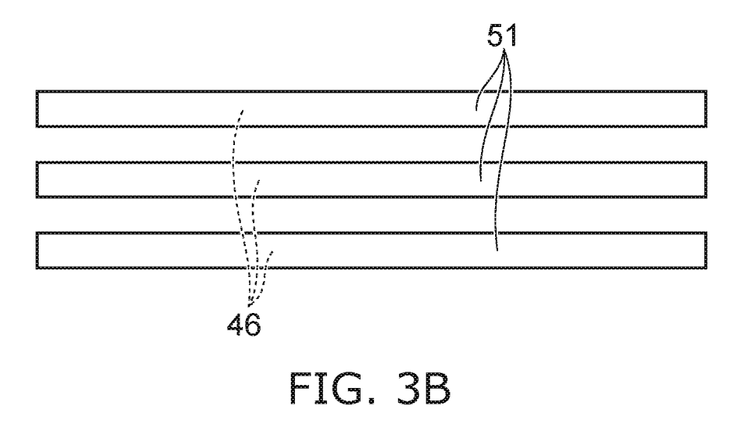

FIG. 3B is a schematic plan view of the upper most interconnection layers 46 in the circuit region 20 and the barrier metal films 51 on the interconnection layers 46.

The plan view of other interconnection layers 44, 45 in the circuit region 20 and the barrier metal films 51 on the interconnection layers 44, 45 is similar to FIG. 3A.

The interconnection layer 41 of the sensor region 10 and the interconnection layer 44 of the circuit region 20 are simultaneously formed of the same type of material, and the interconnection layer 41 of the sensor region 10 and the interconnection layer 44 of the circuit region 20 are provided in layers at the same height.

The barrier metal films 51 provided on the lower surface of the interconnection layer 41 of the sensor region 10 and the barrier metal films 51 provided on the lower surface of the interconnection layer 44 of the circuit region 20 are simultaneously formed of the same type of material. The barrier metal film 51 provided on the upper surface of the interconnection layer 41 of the sensor region 10 and the barrier metal film 51 provided on the upper surface of the interconnection layer 44 of the circuit region 20 are also simultaneously formed of the same type of material.

The interconnection layer 42 of the sensor region 10 and the interconnection layer 45 of the circuit region 20 are simultaneously formed of the same type of material, and the interconnection layer 42 of the sensor region 10 and the interconnection layer 45 of the circuit region 20 are provided in layers at the same height.

The barrier metal film 51 provided on the lower surface of the interconnection layer 42 of the sensor region 10 and the barrier metal film 51 provided on the lower surface of the interconnection layer 45 of the circuit region 20 are also simultaneously formed of the same type of material. The barrier metal film 51 provided on the upper surface of the interconnection layer 42 of the sensor region 10 and the barrier metal film 51 provided on the upper surface of the interconnection layer 45 of the circuit region 20 are also simultaneously formed of the same type of material.

The light shielding layer 43 of the sensor region 10 and the upper most interconnection layer 46 of the circuit region 20 are simultaneously formed of the same type of material, and the light shielding layer 43 of the sensor region 10 and the interconnection layer 46 of the circuit region 20 are provided in layers having the same height.

The barrier metal film 51 provided on the upper surface of the light shielding layer 43 of the sensor region 10 and the barrier metal film 51 provided on the upper surface of the interconnection layer 46 of the circuit region 20 are simultaneously formed of the same type of material. After that, the barrier metal film 51 provided on the upper surface of the light shielding layer 43 of the sensor region 10 are processed into a pattern.

The barrier metal films 51 suppress partial disappearance (void) due to thermal stress of the interconnection layers 41, 42, 44, 45, 46, and increase reliability of the interconnection layers 41, 42, 44, 45, 46. Widths of the interconnection layers 41, 42, 22, 45, 46 with the barrier metal film 51 can be smaller than widths of the interconnection layers 41, 42, 22, 45, 46 without the barrier metal film 51. The barrier metal film 51 allows for fine interconnections.

The reliability of the fine interconnections can be increased by covering the entire surface of at least one of the upper surfaces and the lower surfaces of the interconnection layers 41, 42, 44, 45, 46 having narrower widths in comparison with the light shielding layer 43 with the barrier metal films 51.

The barrier metal film 51 can inhibit the supply of hydrogen ion ($H^+$) to the substrate 71. If silicon atoms (Si) are not terminated with $H^+$ at an interface of the substrate (silicon substrate) 71 and the insulating film 72, dangling bonds of Si are generated. Electrons trapped at the dangling bonds may flow as a dark current during charge transfer operation, and cause degradation of the characteristics in the dark.

According to the embodiment, since the barrier metal film 51 is partially provided on the light shielding layer 43 of the sensor region 10, hydrogen introduced into the insulating film 34 due to the film formation process passes through a portion where the barrier metal films 51 are not provided and easily diffuses to the surface of the substrate 71 in a later thermal process.

For that reason, sufficient amount of $H^+$ can be supplied to the dangling bonds of the silicon substrate 71, the electrons can be suppressed from being trapped at the dangling bonds, and the characteristics in the dark can be improved. Since the barrier metal film 51 is partially provided on the light shielding layer 43, the reliability of the light shielding layer 43 can be increased in comparison with the case of not providing the barrier metal films 51 at all.

According to the embodiment like this, both of improvement of the characteristics in the dark and improvement of the reliability of the interconnection layers 41 to 42, 44 to 46 and the light shielding layer 43 are compatible.

Figure 7:
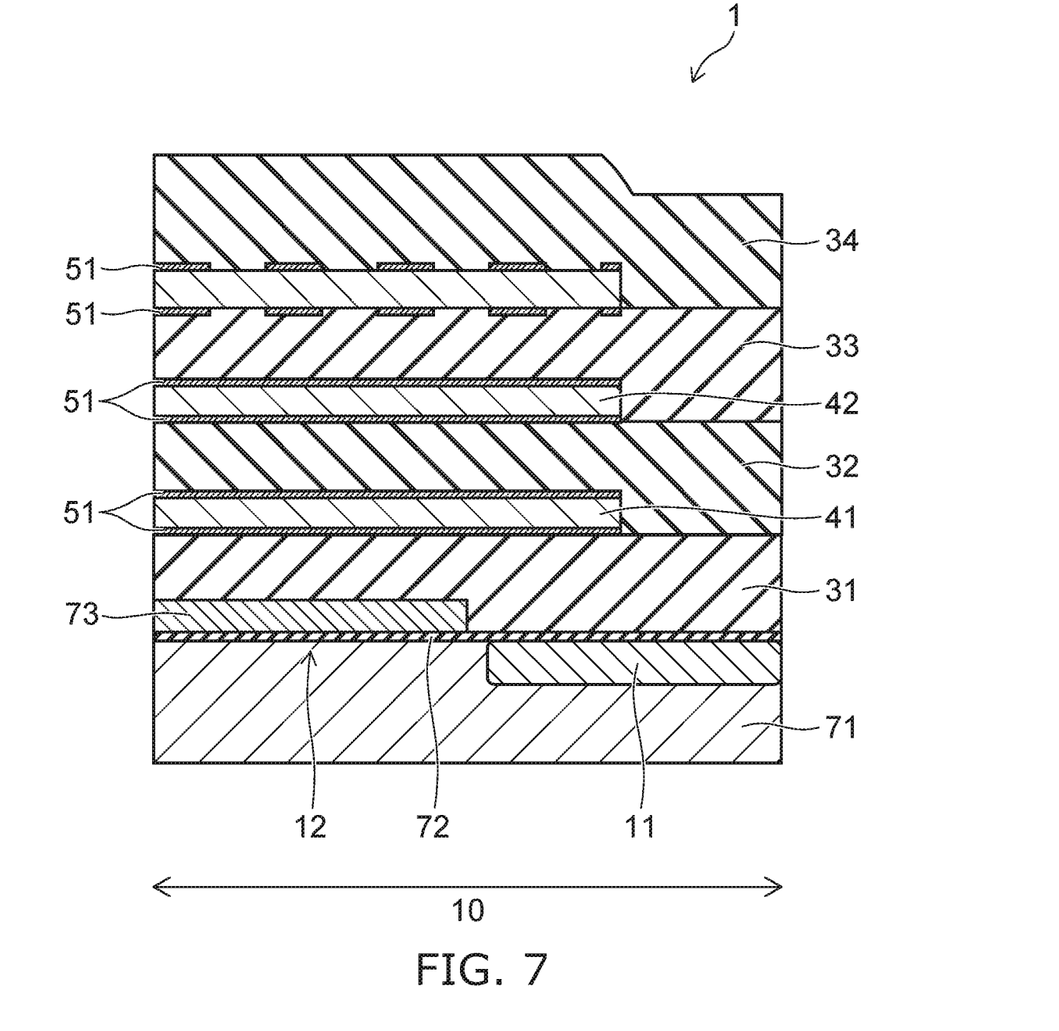
FIG. 7 is a schematic cross-sectional view of the sensor region in the solid-state imaging device of the embodiment of the invention.

FIG. 7 is a schematic cross-sectional view of other example of the sensor region 10 in the solid-state imaging device of the embodiment.

In this example, the barrier metal film 51 is also partially provided on the lower surface of the light shielding layer 43 of the sensor region 10. An overlapping region in a vertical direction of the barrier metal film 51 provided on the upper surface of the light shielding layer 43 with the barrier metal film 51 provided on the lower surface of the light shielding layer 43 is made small, and thus hydrogen passes through the light shielding layer 43 from the insulating film 34 to easily diffuse to the substrate 71.

The barrier metal film 51 may be provided also on the lower surface of the upper most interconnection layer 46 of the circuit region 20. The light shielding layer 43 of the sensor region 10 may be disposed between the interconnection layer 41 and the interconnection layer 42.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention,

What is claimed is:

1. A solid-state imaging device, comprising:
a substrate including a sensor region and a circuit region;
a light receiving pixel provided on a surface of the sensor region of the substrate;
a first interconnection layer provided in the sensor region;
a light shielding layer provided in the sensor region and having a larger width than the first interconnection;
a first metal film provided on at least one of an upper surface or a lower surface of the light shielding layer, the first metal film partially covering at least one of the upper surface or the lower surface;
a second interconnection layer provided in the circuit region; and
a second metal film provided on at least one of an upper surface or a lower surface of the second interconnection layer.

2. The device according to claim 1, wherein the second metal film covers an entire surface of at least one of the upper surface or the lower surface of the second interconnection layer.

3. The device according to claim 1, wherein the light shielding layer and the second interconnection layer are provided on a layer at a same height.

4. The device according to claim 1, wherein the first metal film and the second metal film are same type of films.

5. The device according to claim 4, wherein the first metal film and the second metal film include titanium.

6. The device according to claim 1, further comprising an insulating film covering the light shielding layer, the insulating film including hydrogen.

7. The device according to claim 1, wherein the first interconnection layer and the light shielding layer include aluminum, and the first metal film includes titanium.

8. The device according to claim 1, wherein the substrate is a silicon substrate.

9. The device according to claim 1, wherein the light shielding layer is provided above the first interconnection layer.

10. The device according to claim 1, wherein the device is a linear sensor in which a plurality of light receiving pixels are arranged in one direction.

11. A solid-state imaging device, comprising:
a substrate including a sensor region and a circuit region;
a light receiving pixel provided on a surface of the sensor region of the substrate;
a first interconnection layer provided in the sensor region;
a light shielding layer provided in the sensor region and having a larger width than the first interconnection;
a first metal film provided on at least one of an upper surface or a lower surface of the light shielding layer, the first metal film partially covering at least one of the upper surface or the lower surface; and
a third metal film covering all of an upper surface and a lower surface of the first interconnection layer.

12. The device according to claim 11, wherein the first metal film and the third metal film are same type of films.

13. The device according to claim 12, wherein the first metal film and the third metal film include titanium.

* * * * *